United States Patent
Wesselink

(10) Patent No.: US 6,982,595 B2
(45) Date of Patent: Jan. 3, 2006

(54) METHOD AND ARRANGEMENT RELATING TO ELECTRONIC COMPENSATION

(75) Inventor: Reinier Wesselink, PS Reutum (NL)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 0 days.

(21) Appl. No.: 10/433,562

(22) PCT Filed: Dec. 4, 2001

(86) PCT No.: PCT/SE01/02684

§ 371 (c)(1),
(2), (4) Date: Jul. 14, 2003

(87) PCT Pub. No.: WO02/47259

PCT Pub. Date: Jun. 13, 2002

(65) Prior Publication Data

US 2004/0075495 A1 Apr. 22, 2004

(30) Foreign Application Priority Data

Dec. 5, 2000 (SE) .............................. 0004479

(51) Int. Cl.
H03F 1/26 (2006.01)

(52) U.S. Cl. .................... 330/149; 330/124 R
(58) Field of Classification Search ............ 330/53, 330/124 R, 129, 144, 149
See application file for complete search history.

(56) References Cited

U.S. PATENT DOCUMENTS

| | | | |
|---|---|---|---|
| 4,068,186 A | * | 1/1978 | Sato et al. ............... 330/149 |
| 5,304,945 A | | 4/1994 | Myer .................... 330/151 |
| 5,334,946 A | | 8/1994 | Kenington et al. ..... 330/151 X |
| 5,576,660 A | * | 11/1996 | Pouysegur et al. ......... 330/149 |

FOREIGN PATENT DOCUMENTS

| | | |
|---|---|---|
| EP | 0583492 | 2/1994 |
| GB | 1579571 | 11/1980 |
| WO | 92/10062 | 6/1992 |
| WO | 99/25073 | 5/1999 |

OTHER PUBLICATIONS

Patent Abstracts of Japan, Abstract of JP 12–40922, Feb. 8, 2000.

First Office Action issued by the Patent Office of the People's Republic of China in corresponding Chinese Patent Application No. 01822497.0; Dec. 24, 2004, pp. 1–14.

* cited by examiner

Primary Examiner—Steven J. Mottola
(74) Attorney, Agent, or Firm—Nixon & Vanderhye P.C.

(57) ABSTRACT

The invention addresses the problem of obtaining ways and means for providing a compensational gain, which can be used for gain compensation in connection with power amplifiers and other devices. According to the invention a power splitter splits a signal into two components. A phase shifter introduces a frequency dependent phase shift in one the components. A change of amplitude is introduced in one of the components. A combiner combines the components. By selecting appropriately the frequency dependent phase and the change of amplitude, a desired gain compensation characteristic is achieved.

20 Claims, 9 Drawing Sheets

METHOD AND ARRANGEMENT RELATING TO ELECTRONIC COMPENSATION

This application is the U.S. national phase of international application PCT/SE01/02684 filed 4 Dec. 2001, which designated the US.

TECHNICAL FIELD OF THE INVENTION

The present invention pertains to the field of methods and arrangements relating to electronic compensation, and more particularly to the part of this field concerning gain compensation.

BACKGROUND AND RELATED ART

It is common in the art with devices that receive an input power and in response to the received input power transmit an output power. The ratio between the output power and the input power is normally referred to as (power) gain. The gain is often frequency dependent. This may be desirable in some instances but in most cases undesirable.

A power amplifier is a device which is used for amplifying a signal power. The power amplifier is used in many technical applications, e.g. broadcast radio and TV, wireless communications (such as cellular telephony), cable TV, hi-fi audio equipment et cetera. For the power amplifier, the frequency dependence of the gain is often an important feature to consider.

The construction of the power amplifier is often based on transistor technology, and the bipolar transistor is probably the most frequently used transistor element in power amplifiers. However, vacuum tubes, once considered obsolete, are still used today for some applications. The power amplifier can be built with discrete components or with components arranged on an integrated circuit.

The power amplifier is normally designed to provide power amplification for signals in a predetermined operating frequency range. However, it is difficult to obtain a uniform (constant) gain over the whole of the operating range, especially for broadband ranges. Normally, the gain of the power amplifier decreases with increasing frequency.

The frequency dependence of the gain of the power amplifier is troublesome in many technical applications. One such application is the so-called feed forward amplifying circuit. The feed forward amplifying circuit includes a main power amplifier, which operates in a non-linear mode. The feed forward amplifying circuit further includes a feed forward loop. The feed forward loop includes means for generating an indication signal which is indicative of distortion products due to the non-linearity of the main amplifier. The feed forward loop further includes an (linear) error amplifier which generates an error signal by amplifying the indication signal. The error amplifier is set so that the error signal corresponds as closely as possible to the distortion products generated in the main amplifier. The error signal is subtracted from an output signal from the main amplifier, thereby suppressing the distortion products. However, if the suppression of the distortion products is to be efficient, the gains of the main and error amplifier must not vary with frequency to any considerable extent.

Another application, where the frequency dependence of the gain is troublesome, is cable TV transmissions, where the effect of lower gain at higher frequencies may lead to a loss of picture detail and colour saturation.

Naturally, the power amplifier is not the only device for which the frequency dependence of the gain can be troublesome. The frequency dependency is also troublesome, for example, for couplers, transmission cables, stiplines, microstrips, mixers and radio frequency equipment in general.

U.S. Pat. No. 5,656,973 discloses an amplifying circuit, which includes an MMIC (Monolithic Microwave Integrated Circuit) power amplifier in combination with a compensation circuit. The compensation circuit is designed to have a frequency response which counteracts a frequency dependence of gain of the power amplifier. The compensation circuit is a resonant band-pass filter including a resistor, an inductor and a capacitor. This compensation circuit, however, has some drawbacks. The gain compensation associated with the compensation circuit cannot be easily tuned. A big "spread" in the actual compensation can be expected due to variations in component values. Furthermore, the compensation circuit is not suitable for providing minor corrections (±0.1 dB or so).

U.S. Pat. No. 5,280,346 discloses an equalising amplifying circuit, which is used for compensating for frequency dependent losses in a television cable. The circuit includes an equalising network and a variable amplifier for generating a correction signal, which compensates for the frequency dependence of the cable. In order to make the circuit more useful for different lengths of cable, the circuit includes a positive feedback loop having an attenuator. Because of the positive feedback, the circuit can be used with different lengths of cable by appropriately controlling the variable amplifier. The circuit is, however, rather complicated and expensive. Another drawback is that the circuit can only be used for lower frequencies (base band) and not for higher frequencies (radio frequency).

SUMMARY OF THE INVENTION

The present invention addresses mainly the problem of obtaining ways and means for providing frequency dependent gain compensation which is relatively simple and cheap and which can easily be adopted to varying conditions, such as different operating frequency ranges and different needs regarding amounts of gain compensation.

The above-stated problem is solved with method in which a signal is split into two components. One of the components is provided with a frequency dependent phase shift. One of the components is provided with a change of amplitude. After the providing of the phase shift and the change of amplitude, the components are combined. The method provides a compensational gain, which is determined mainly by the frequency dependent phase shift and the change of amplitude. By properly selecting the frequency dependent phase shift and the change of amplitude, the compensational gain is easily adopted to various conditions, such as different operating frequency ranges and the different amounts of gain compensation needed.

The invention includes also the use of the above method for providing a compensational gain to any device having a gain with an unwanted frequency dependence. The invention further includes a method for power amplification using a power amplifier having a non-flat gain, whereby the above method is used for providing a compensational gain, which compensates for the non-flat gain of the power amplifier.

The above-stated problem is solved also with a compensation circuit. The compensation circuit comprises means for splitting a signal into two components. The compensation circuit comprises means for providing a frequency dependent phase shift into one of the components. The compensation circuit comprises means for providing one of the components with a change of amplitude. The compensation circuit comprises means for combining the components. The compensational gain of the compensation circuit is determined mainly by the frequency dependent phase shift and the change of amplitude. By properly selecting the phase shift and the change of amplitude provided in the compensation circuit, the compensational gain is easily adopted to various conditions, such as different operating frequency ranges and different amounts of gain compensation needed.

The invention includes also the use of the above compensation circuit for providing compensational gain to any device having a gain with an unwanted frequency dependence. The invention includes also a power amplifying circuit with a power amplifier with having a non-flat gain, the above compensation circuit being included for providing a compensational gain, which compensates for the non-flat gain of the power amplifier.

A main object of the invention is thus to provide frequency dependent gain compensation, and the invention includes methods as well as devices where this object is achieved.

The invention has several advantages. With the invention, the frequency dependent compensational gain is provided easily and at relatively low cost. The compensational gain is easily provided for varying conditions, such as different operating frequency ranges and different amounts of gain compensation needed. The compensational gain can be provided for higher (radio frequency) frequency ranges. In particular, the compensational gain is advantageously provided for frequency ranges lying above 1 GHz.

The invention will now be described further using preferred embodiments and referring to the drawings.

PREFERRED EMBODIMENTS

Figure 1:
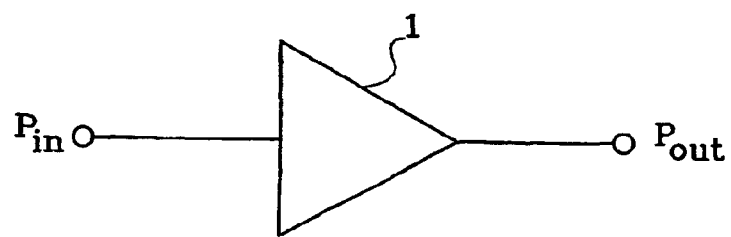
FIG. 1 is a simple block diagram of a power amplifier.
Figure 2:
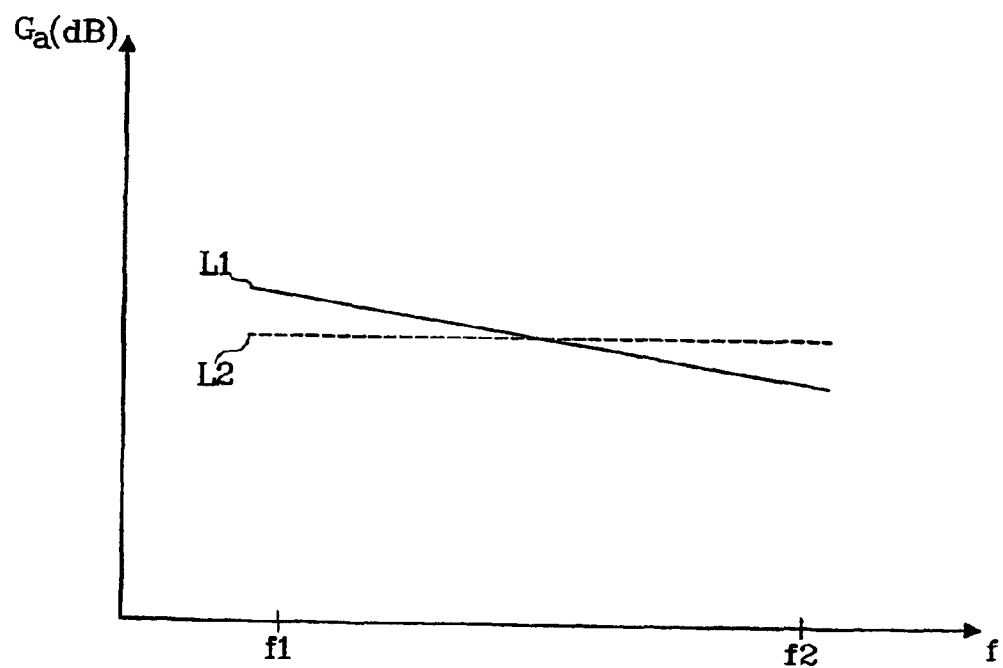
FIG. 2 is a diagram illustrating real and ideal gain of the power amplifier.

FIG. 1 is a simple block diagram of a power amplifier 1. The power amplifier 1 may be a transistor power amplifier, for example based on bipolar, LDMOS or GaAs transistors. The power amplifier 1 is arranged for receiving an input power $P_{in}$ via an input terminal and for delivering an output power $P_{out}$ at an output terminal. The power amplifier is designed for providing power amplification for signals in a predetermined operating frequency range [f1,f2]. In FIG. 2 is shown a diagram with a curve L1 which, schematically, illustrates how a gain $G_a$ of the power amplifier 1 varies with frequency f within the operating frequency range. The gain $G_a$ decreases with increasing frequency. Consequently, the curve L1 has a negative slope. As mentioned earlier, this is often undesirable. And it is instead desirable to have a gain which is independent of frequency, at least within the operating frequency range of the power amplifier 1. A curve L2 (dashed) in FIG. 2 illustrates this ideal situation. Since there is no dependency on frequency, the curve L2 is completely flat.

Figure 3:
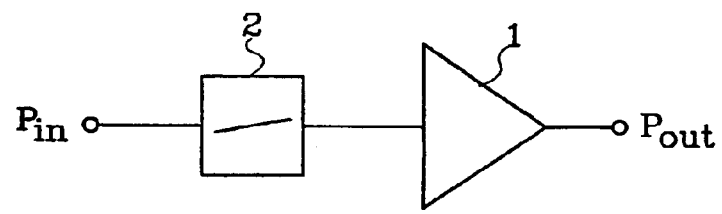
FIG. 3 is a simple block diagram of a power amplifying circuit including a power amplifier and a compensation circuit according to the invention.
Figure 4:
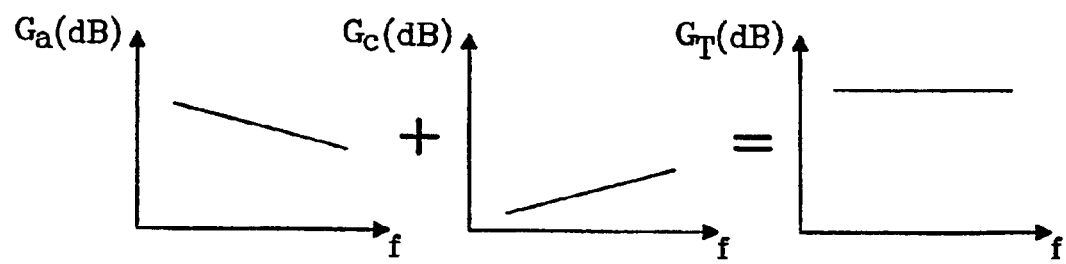
FIG. 4 is diagrammatic illustration of gain compensation according to the invention.

FIGS. 3 and 4 illustrate the principle according to which the present invention provides a power amplification which is essentially frequency independent. FIG. 3 is a block diagram of an amplifying circuit according to the invention. The circuit in FIG. 3 includes a power amplifier 1 and a compensation circuit 2, which is arranged in series with the power amplifier 1. In FIG. 3, the compensation circuit 2 is arranged before the power amplifier 1 but, alternatively, the compensation circuit 2 is instead arranged after the power amplifier 1. However, the efficiency of the power amplifying circuit is higher with the compensation circuit 2 being arranged before the power amplifier 1. The compensation circuit 2 has an associated gain $G_c$. The gain $G_c$ of the compensation circuit 2 has a frequency dependence which is adopted to compensate for a frequency dependence in a gain $G_a$ of the power amplifier 1. This is illustrated in FIG. 4. A first diagram in FIG. 4 shows the gain versus frequency dependency of the power amplifier 1. The gain $G_a$ of the power amplifier 1 decreases with increasing frequency, resulting in a gain curve with a negative slope. A second diagram in FIG. 4 shows the gain versus frequency dependency of the compensation circuit 2. The gain $G_c$ of the compensation circuit 2 increases with increasing frequency in a manner which compensates for decreasing gain of the power amplifier 1. Consequently, the gain, curve of the compensation circuit 2 has a positive slope which counteracts the negative slope of the gain curve of the power amplifier 1. A third diagram in FIG. 4 shows a frequency dependency of a total gain $G_T$ of the power amplifying circuit in FIG. 3. The total gain $G_T$ is the combined gains of the power amplifier 1 and the compensation circuit 2. The total gain $G_T$ is essentially independent of frequency, due to the fact that the compensation circuit 2 compensates for the frequency dependent (non-flat) gain $G_a$ of the power amplifier 1.

Figure 5:
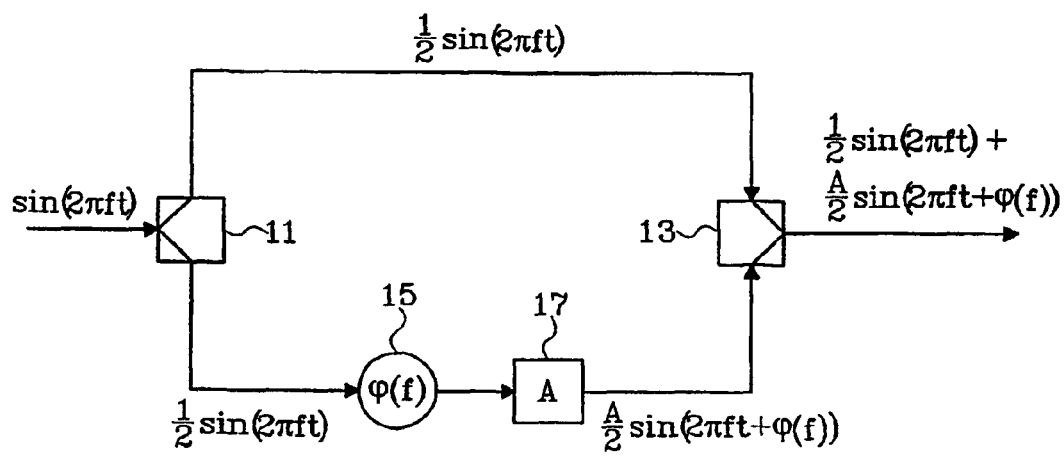
FIG. 5 is a block diagram of a first embodiment of a compensation circuit according to the invention.

FIG. 5 is a block diagram of a first embodiment of the compensation circuit 2 according to the present invention. The compensation circuit 2 in FIG. 5 comprises a power splitter 11 which includes an input for receiving a signal, i.e. a time varying power. In the particular example of FIG. 5, the received signal is harmonically oscillating according to $\sin(2\pi ft)$—for the sake of simplicity, an amplitude of the input signal is set to unity. The power splitter 11 is arranged for splitting the input signal into two components equal to (1/2)·sin(2πft). The compensation circuit 2 of FIG. 5 further comprises a combiner 13. A first output of the power splitter 11 is connected to a first input of the combiner 13 via a first signal branch. The combiner 13 receives via its first input one of the components (1/2)·sin(2πft) from the power splitter 11. A second input of the combiner 13 is connected to a second output of the power splitter 11 via a second signal branch. The second signal branch includes a phase shifter 15 and a variable attenuator 17, which are connected in series. The phase shifter 15 is arranged to produce a frequency dependent phase shift φ(f). The attenuator 17 is used to produce a change of amplitude which is essentially independent of frequency, at least in the operating frequency range of the power amplifier. The phase shifter 15 and the attenuator 13 introduce a phase shift and a change of amplitude in the remaining component (1/2)·sin(2πft), which consequently is changed to (A/2)·sin(2πft+φ(f)). Here A denotes an attenuation value in the range [0,1]. An attenuation value A of 0 corresponds to complete signal attenuation and an attenuation value A of 1 corresponds to zero signal attenuation. The combiner 13 receives the component (A/2)·sin(2πft+φ(f)) via the second input. The combiner 13 is arranged for generating a combined signal ((1/2)·sin(2πft)+(A/2)·sin(2πft+φ(f))) by combining (adding) the components (1/2)·sin(2πft) and (A/2)·sin(2πft+φ(f)) received via the inputs. The combiner 13 is arranged for transmitting the combined signal via an output.

Figure 7:
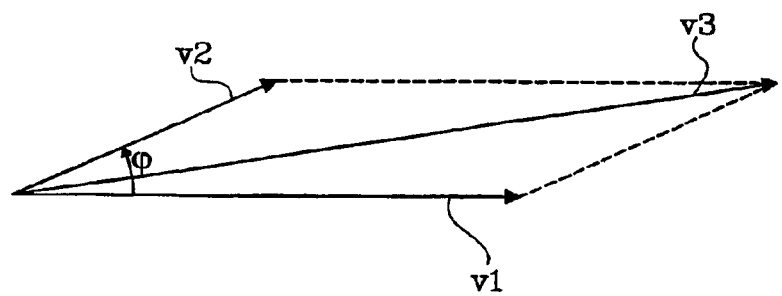
FIG. 7 is a vector diagram.

FIG. 7 is a vector diagram visualising the signal processing of the compensation circuit 2 in FIG. 5. A first vector v1 represents the component (1/2)·sin(2πft) received via the first input of the combiner 13. A second vector v2 represents the component (A/2)·sin(2πft+φ(f)) received via the second input of the combiner 13. The second vector v2 has an amplitude which is A times the amplitude of the first vector v1. An angle between the first vector v1 and the second vector v2 corresponds to the phase shift φ(f) introduced by the phase shifter 15. A vector sum of the first and the second vector v1 and v2 is shown as a third vector v3 in FIG. 7. The third vector v3 represent the combined signal (1/2)·sin(2πft)+(A/2)·sin(2πft+φ(f)). Using the geometry of the vector diagram in FIG. 7, it can be shown that the gain $G_c$ of the compensation circuit 2 in FIG. 5, as seen between the input of the power splitter 11 and the output of the combiner 13, can be written as $$G_c = \frac{1}{2}\sqrt{1 + A^2 + 2A\cos(\varphi(f))}.$$ eq. (1)

Figure 8:
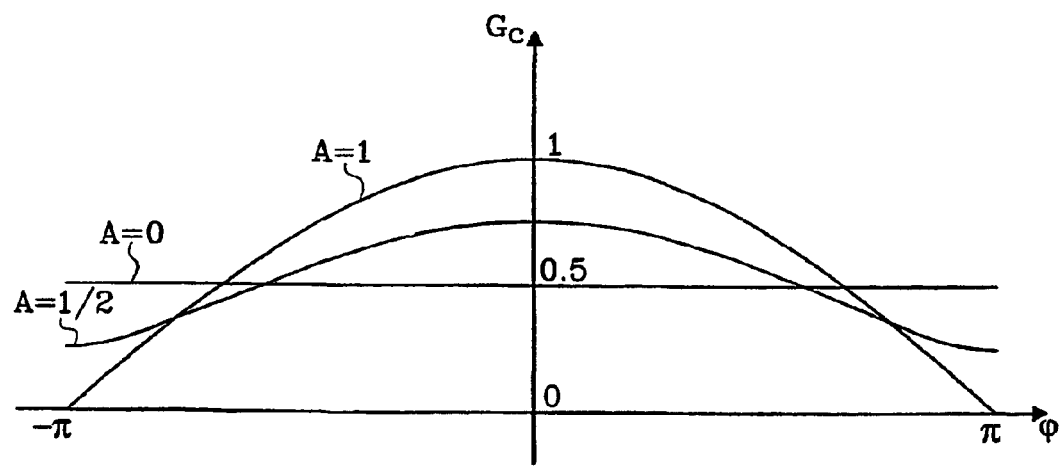
FIG. 8 is a diagram with curves illustrating a gain of the compensation circuit in FIG. 5 as a function of a phase shift.

FIG. 8 is a diagram with curves illustrating the gain $G_c$ as a function of the phase shift φ. FIG. 8 includes gain curves for values of φ in the range [−π,π]. There are three curves for different selections of the attenuation value A (A=0, A=1/2 and A=1). From FIG. 8 and equation (1), it follows that the gain $G_c$ is an even function of the phase shift φ and has a period of 2π. The influence of the attenuation value A can be seen from FIG. 8. The gain curves become more flat, the smaller the attenuation value A—for A=0, the corresponding gain curve is completely flat.

Figure 6:
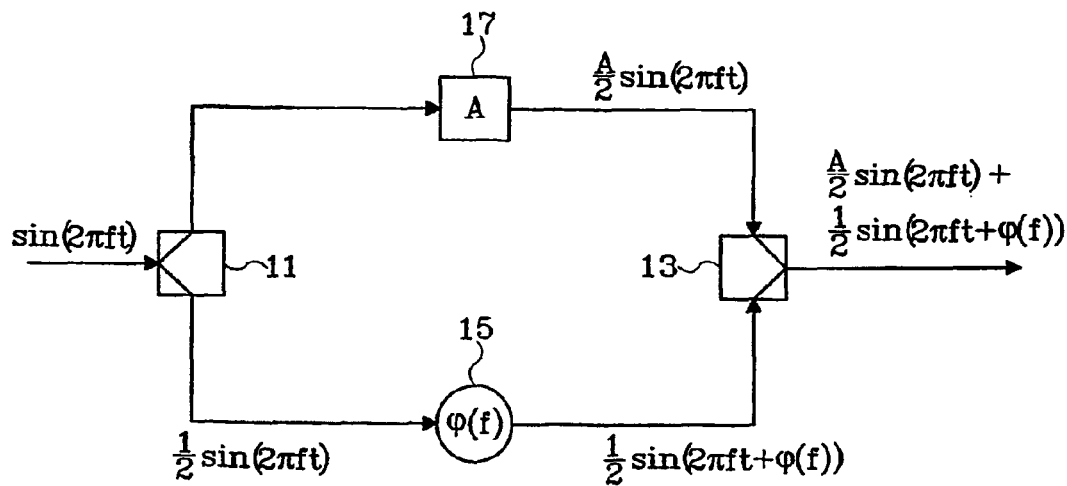
FIG. 6 is a block diagram of second embodiment of a compensation circuit according to the invention.

FIG. 6 is block diagram of a second embodiment of the compensation circuit 2 according to the present invention. The embodiment in FIG. 6 differs from the one in FIG. 5 only in that the attenuator 17 is arranged in the first signal branch instead. However, equation (1) is valid also for the embodiment in FIG. 6.

Figures 9, 10:
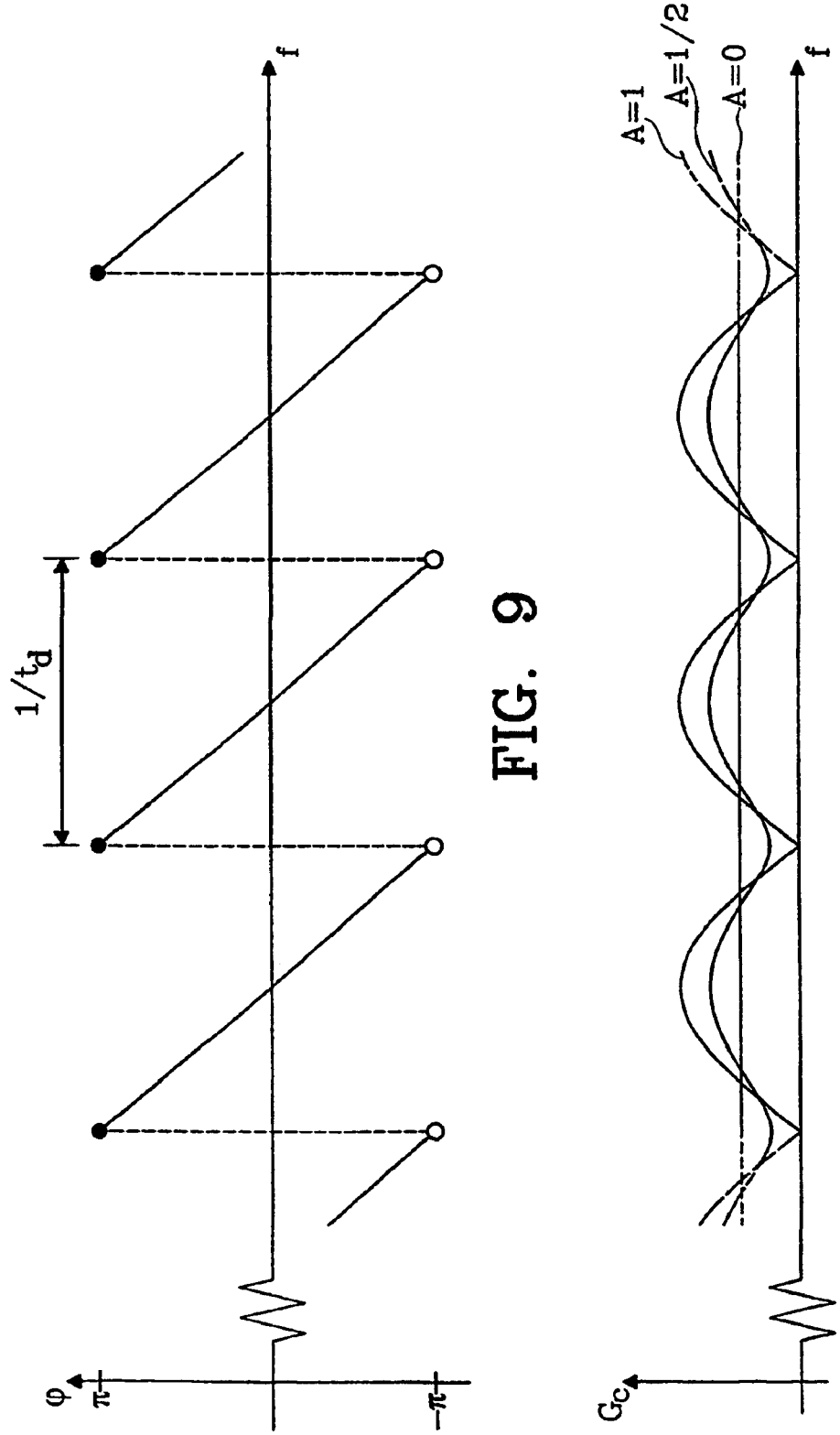
FIG. 9 is a diagram with a graph illustrating a frequency dependent phase shift introduced by a time delay.
FIG. 10 is a diagram with curves illustrating a gain of the compensation circuit in FIG. 5 as function of frequency.

Since the phase shift φ(f) introduced by the phase shifter 15 is dependent on frequency, the gain $G_c$ of the compensation circuits 2 in FIGS. 5 and 6 will depend on frequency as well. There are many ways to arrange the phase shifter 15 so that an appropriate frequency dependent phase shift φ(f) is obtained. A simple and useful way is to arrange the phase shifter 15 to introduce a time delay $t_d$. For example, the phase shifter 15 may include a delay line. With a delay line having an effective length L, the corresponding time delay is L/c, where c denotes a signal propagation speed. As is well understood by the skilled person, the time delay $t_d$ is equivalent to a phase shift φ(f) which varies linearly with frequency according to φ(f)=−2π$t_d$f. This relationship between the phase shift φ(f) and frequency f is illustrated with a diagram in FIG. 9, where the phase shift is given by its principal value, i.e. an equivalent value in the range ]−π,π]. A corresponding relationship between the gain G, and frequency f is illustrated with a diagram in FIG. 10. In the diagram of FIG. 10, the dependence on frequency f of the gain $G_c$ is shown for three selections of the attenuation value A (once again A=0, A=1/2 and A=1). The gain curves in FIG. 10 are periodic, and a period of the gain $G_c$ depends on the time delay $t_d$. As is indicated in FIG. 9, the phase shift φ changes from π to −π with a change of frequency equal to 1/$t_d$. The period of the gain curves in FIG. 10 is thus 1/$t_d$.

The time delay $t_d$ is selected having regard to the predetermined operating frequency range of the power amplifier 1. The time delay $t_d$ is preferably selected so that the operating frequency range falls within a frequency range where the gain curves have positive slopes—provided of course that the gain $G_a$ of the power amplifier 1 decreases with increasing frequency. One approach is to first calculate a centre frequency $f_c$ of the operating frequency range [f1,f2] ($f_c$=(f1+f2)/2). The time delay $t_d$ is then selected so that the centre frequency $f_c$ is placed in a middle position of a positive slope of the gain curves. To do this for the embodiments in FIGS. 5 and 6, the time delay $t_d$ should be selected so that the phase shift φ($f_c$), which corresponds to the centre frequency $f_c$, has a principal value of π/2, i.e. φ($f_c$)=π/2−n2π (n=1, 2, 3, . . . ). Possible values for the time delay $t_d$, according to this approach, are given by $$t_d = \frac{n - 1/4}{f_c}$$ eq. (2)

The attenuation value A is preferably selected so that the compensation circuit 2 compensates as well as possible for the frequency dependence of the gain $G_a$ of the power amplifier 1. The selection of the attenuation value A may be done by calculation and/or experimentation.

Figure 11:
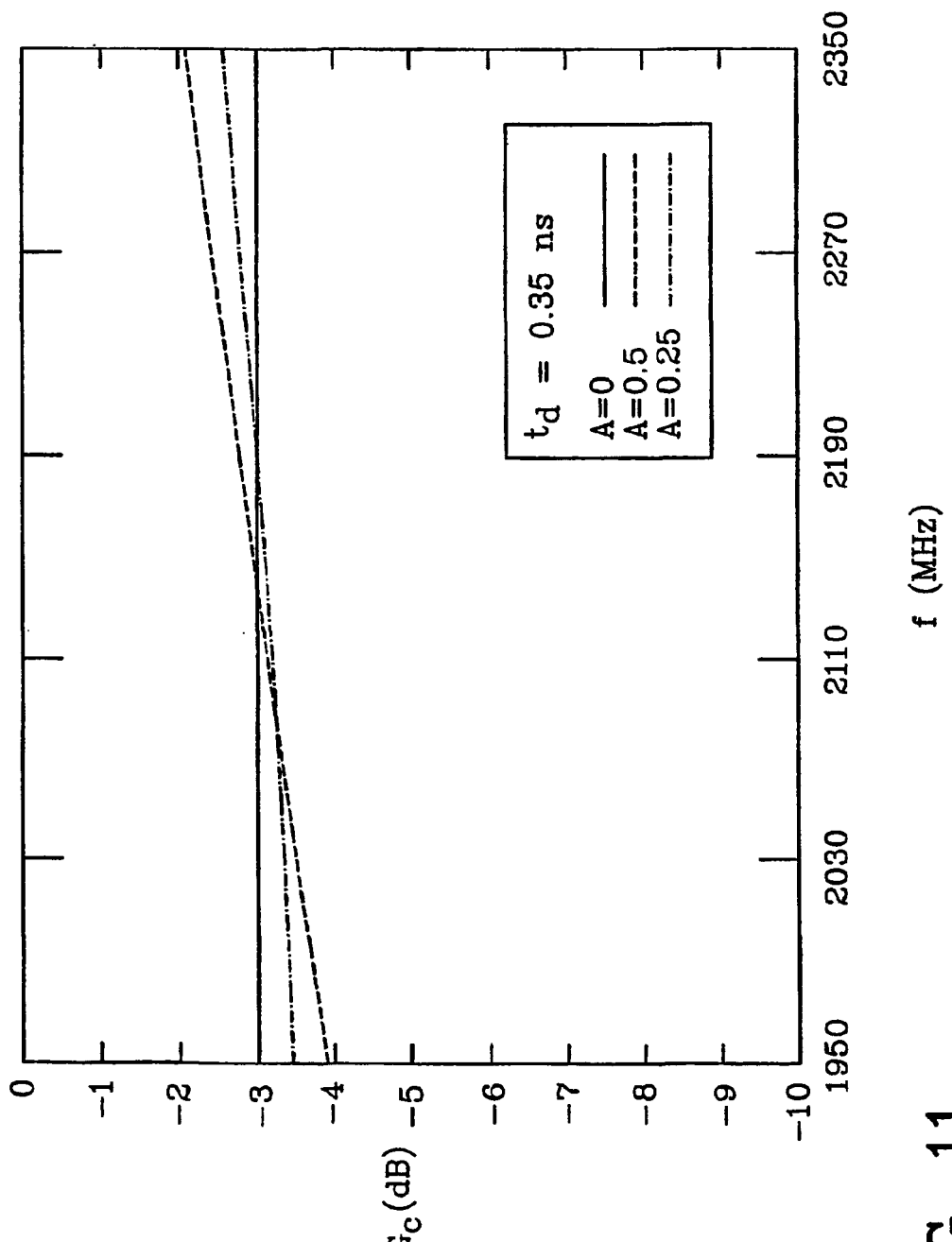
FIG. 11 is a diagram with curves illustrating, by way of example, the gain of the compensation circuit in FIG. 5 for specific parameter selections.

For example, let the operating frequency range be from 1950 MHz to 2350 MHz. The centre frequency $f_c$ is 2150 MHz. With n=1, the time delay $t_d$ is 0.35 ns. With a propagation speed c close to the speed of light, this time delay $t_d$ corresponds to a delay line having an effective length L of about 0.1 m. The phase shift φ($f_c$) at the centre frequency $f_c$ is −1.5π. Gain curves corresponding to this selection of the time delay are shown in a diagram of FIG. 11. In FIG. 11 there are three gain curves, corresponding to three selections of the attenuation value A (A=0, A=0.25 and A=0.5). The attenuation value A determines the slopes of the curves.

Figure 12:
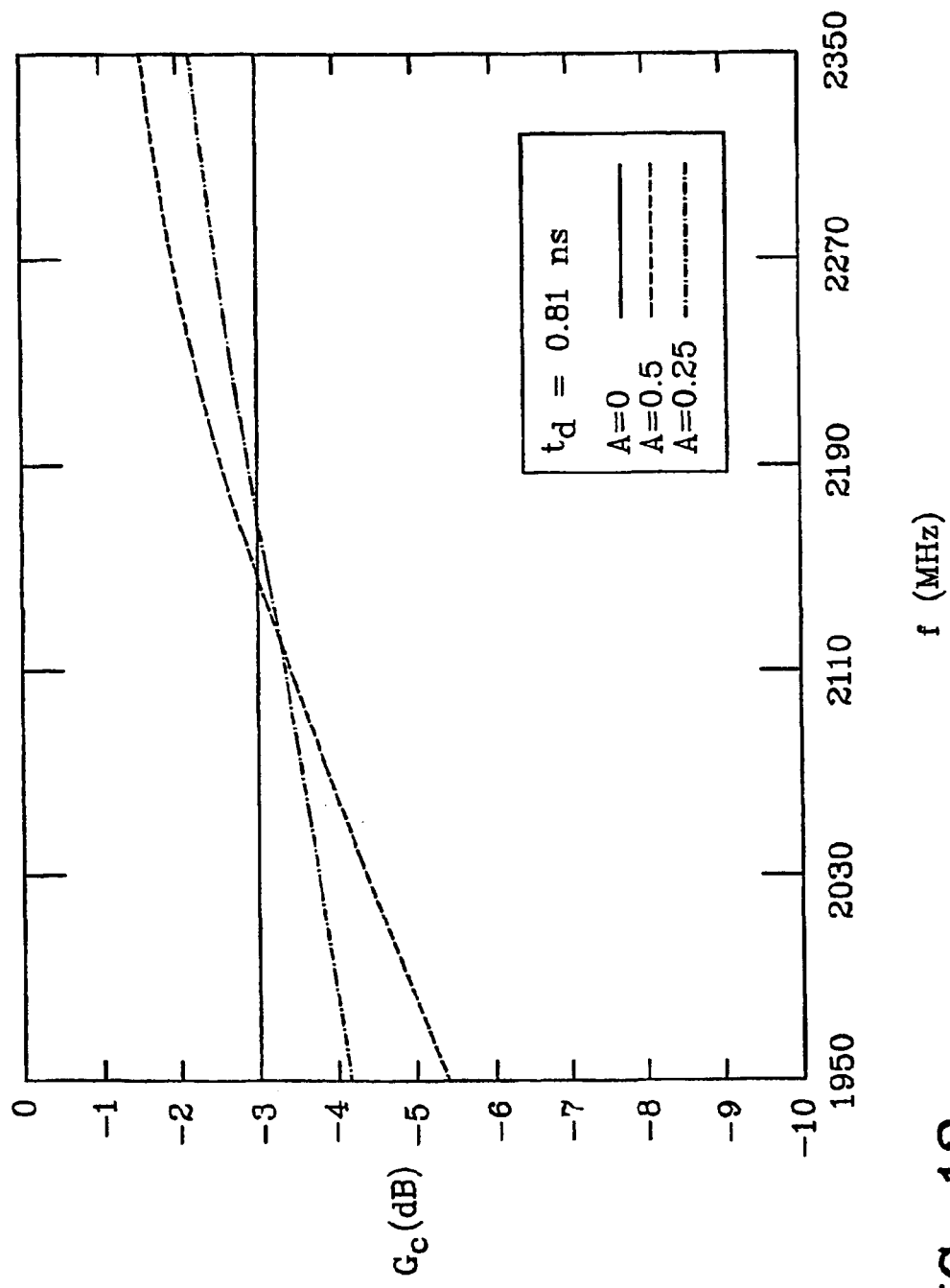
FIG. 12 is a diagram with curves illustrating, by way of example, the gain of the compensation circuit in FIG. 5 for specific parameter selections.

If stronger gain compensation (increased slope) is desired, two or more compensation circuits 2 can be used in combination. Alternatively, a higher value of n can be selected. For n=2, the time delay $t_d$ is 0.81 ns, corresponding to a delay line having an effective length of about 0.24 m. In FIG. 12 there are three gain curves for this selection of the time delay $t_d$. The gain curves in FIG. 12 correspond to three different selections of the attenuation value A (A=0, A=0.25 and A=0.5).

Figure 13:
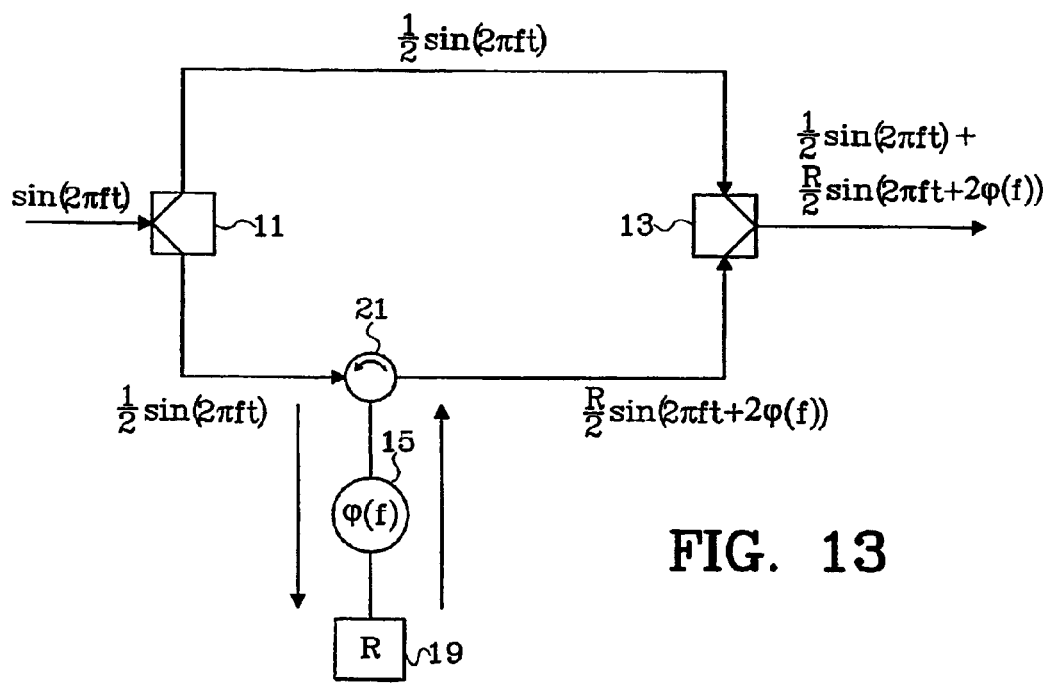
FIG. 13 is a third embodiment of a compensation circuit according to the present invention.

FIG. 13 is a block diagram of a third embodiment of the compensation circuit 2 according to the present invention. In the embodiments in the FIGS. 5 and 6, a change in signal amplitude was obtained with the attenuator 17. In the embodiment of FIG. 13, signal reflection is used instead to obtain a change in signal amplitude.

The compensation circuit 2 in FIG. 13 comprises a power splitter 11 which includes an input for receiving a signal. In the particular example of FIG. 13, the received signal is harmonically oscillating according to $\sin(2\pi ft)$—for the sake of simplicity, an amplitude of the input signal is set to unity. The power splitter 11 is arranged for splitting the input signal into two components equal to $(1/2)\cdot\sin(2\pi ft)$. The compensation circuit 2 of FIG. 13 further comprises a combiner 13, and a first output of the power splitter 11 is connected to a first input of the combiner 13 via a first signal branch. The combiner 13 receives, via its first input, a first of the components $(1/2)\cdot\sin(2\pi ft)$ from the power splitter 11. The compensation circuit 2 in FIG. 13 includes also a second signal branch connecting the power splitter 11 and the combiner 13. The second signal branch includes a circulator 21 having three ports. The circulator 21 has the property that a signal received at a first port of the circulator 21 is transferred to a second port of the circulator 21 and a signal received at the second port is transferred to a third port of the circulator 21, and so on. A second output of the power splitter 11 is connected to the first port of the circulator 21. The second port of the circulator 21 is connected to a phase shifter 15 providing a frequency dependent phase shift $\phi(f)$. The phase shifter 15 can, for example, include a delay line having an associated time delay td. The phase shifter 15 is also connected to a signal reflector 19. The signal reflector 19 has an associated reflection coefficient R in the range [−1,1]. In principle, the signal reflector 19 can be any arrangement having an impedance Z. If a signal line, leading up to the signal reflector 19, has a characteristic impedance $Z_0$, the reflection coefficient R is equal to $(Z-Z_0)/(Z+Z_0)$. In radio applications the characteristic impedance $Z_0$ is often set to 50 Ω. The circulator 21 receives, via its first port, the remaining, second, component $(1/2)\cdot\sin(2\pi ft)$ from the power splitter 11. The second component is then transferred to the second port of the circulator 21 and passes the phase shifter 15 a first time. After passing the phase shifter 15, the second component is reflected by the signal reflector 19, the second component thereby passing the phase shifter 15 a second time. After passing the phase shifter 15 a second time, the second component is received at the second port of the circulator 21 and transferred to the third port of the circulator 21. The third port of the circulator 21 is connected to a second input of the combiner 13, and the combiner 13 thus receives the second component via its second input. The signal reflector 19 and the phase shifter 15 influence the amplitude and the phase of the second component, and the second component, when received by the combiner 13, is therefore equal to $(R/2)\cdot\sin(2\pi ft+2\phi(f))$. The combiner 13 is arranged for generating a combined signal $((1/2)\cdot\sin(2\pi ft)+(R/2)\cdot\sin(2\pi ft+2\phi(f)))$ by combining (adding) the components $(1/2)\cdot\sin(2\pi ft)$ and $(R/2)\cdot\sin(2\pi ft+2\phi(f))$ received via the inputs. The combiner 13 is arranged for transmitting the combined signal via an output.

Equation (1) can be used to calculate the gain $G_c$ of the compensation circuit in FIG. 13 by substituting the attenuation value A for the reflection coefficient R and by substituting $\phi(f)$ for $2\phi(f)$.

Figure 14:
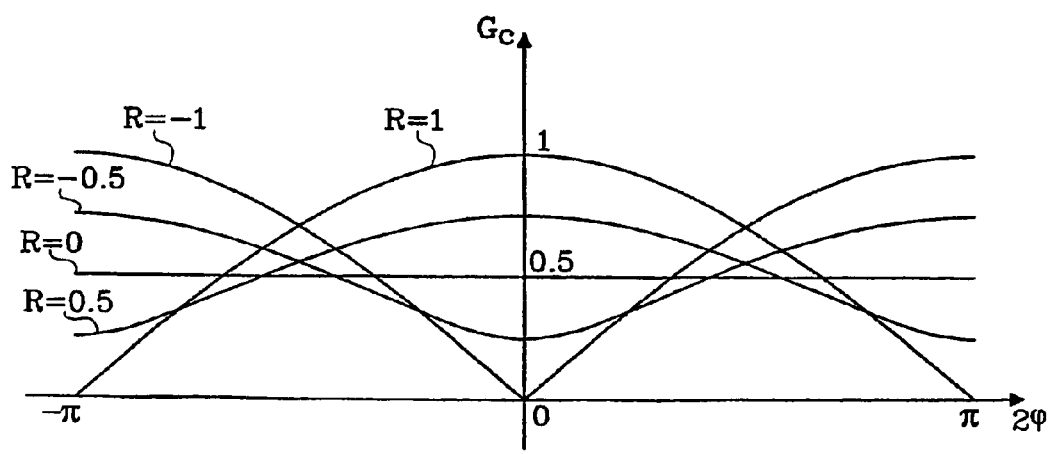
FIG. 14 is a diagram with curves illustrating a gain of the compensation circuit in FIG. 13 as a function a phase shift.

FIG. 14 is a diagram illustrating the gain $G_c$ of the compensation circuit 2 in FIG. 13 as function of $2\phi$ for five different selections of the reflection coefficient (R=0, R=±0.5 and R=±1). For positive values of the reflection coefficient R, the gain curves in FIG. 14 are similar to the gain curves in FIG. 8. For negative values of the reflection coefficient R, the gain curves are at their minimum for $2\phi=0$ and at their maximum for $2\phi=\pm\pi$, which is opposite to the behaviour of the gain curves for positive values of the reflection coefficient R.

The approach set out above for selecting appropriate parameter values (A and $t_d$) for the compensation circuits 2 in FIGS. 5 and 6 can be used, mutatis mutandis, for selecting appropriate parameter values (R and $t_d$) for the compensation circuit 2 in FIG. 13.

In the embodiment in FIG. 13, the circulator 21 and the signal reflector 19 are arranged so that the phase shifter 15 is passed twice. Naturally, this is not necessary, and the circulator 21 and the signal reflector 19 are alternatively arranged so that the phase shifter 15 is passed only once. For example, the circulator 15 and the signal reflector 19 can be arranged in the first signal branch instead or be arranged in the second signal branch but after or before the phase shifter 15.

In the embodiments of FIGS. 5, 6 and 13, the power splitter 11 is arranged for splitting the input signal into two components of equal power. This will provide a maximal tuning range for the gain $G_c$, which is beneficial in many instances. However, the invention is not limited to splitting the signal into components of equal power. Let $\rho_1$ and $\rho_2$ represent amplitudes of the components relative to the amplitude of the received signal. Using a similar vector diagram as in FIG. 7 it can be shown that the gain $G_c$ of the compensation circuit 2 in this situation is given by $$G_c = \sqrt{\rho_1^2 + A^2\rho_2^2 + 2A\rho_1\rho_2\cos(X(f))}. \qquad \text{eq. (1.1)}$$

Here X(f) is equal to $\phi(f)$ for the embodiments in FIGS. 5 and 6 and equal to $2\phi(f)$ for the embodiment in FIG. 13.

Figure 15:
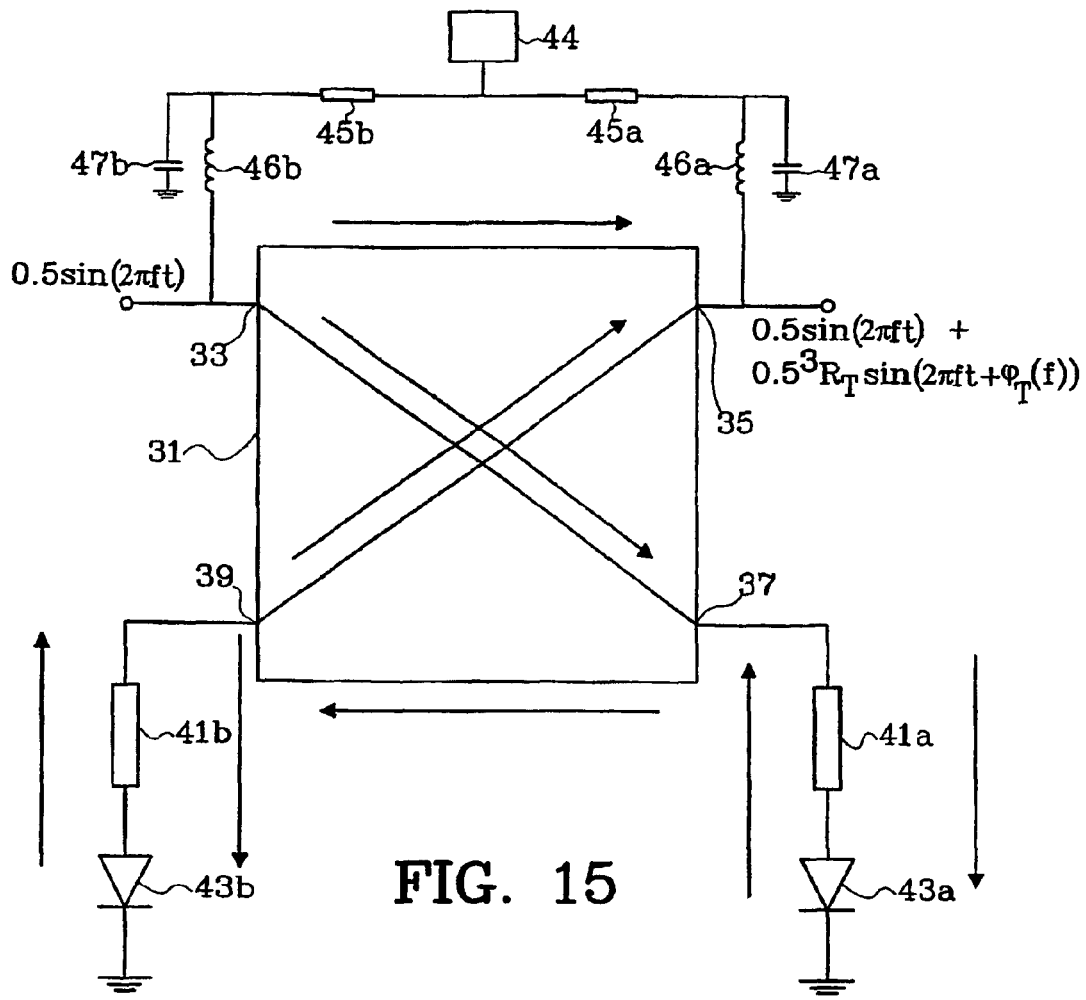
FIG. 15 is a fourth embodiment of a compensation circuit according to the present invention.

FIG. 15 is a block diagram of fourth embodiment of the compensation circuit 2 according to the present invention. The construction of the fourth embodiment is somewhat different from the embodiments in FIGS. 5, 6 and 13. But nevertheless, the fourth embodiment operates according similar principles as the earlier embodiments. The embodiment in FIG. 15 is based on a 3 dB hybrid circuit 31, which includes four ports 33, 35, 37 and 39. The first port 31 is connected to an input terminal, which receives a signal. In the particular example of FIG. 15, the received signal is harmonically oscillating according to $\sin(2\pi ft)$—for the sake of simplicity, an amplitude of the input signal is set to unity. The third port 37 is connected to a first pin diode 43a via a phase shifter in the form of a first delay line 41a. The fourth port 39 is, in a similar manner, connected to a second pin diode 43b via a phase shifter in the form of a second delay line 41b. The pin diodes 43a and 43b, which in turn are connected to ground, serve as signal reflectors. The pin diodes 43a and 43b behave as variable resistors, and resistance values associated with the pin diodes 43a and 43b determine the reflections produced by the pin diodes 43a and 43b. A resistance value of 0 Ω corresponds to a reflection coefficient R of −1 (full reflection with 180° phase shift). If the characteristic impedance $Z_0$ is 50 Ω, then a resistance value of 50 Ω corresponds to a reflection coefficient R of 0 (no reflection). A very large resistance value corresponds to a reflection coefficient R of 1 (full reflection).

At the first port 33, the input signal is split into two components equal to $0.5\cdot\sin(2\pi ft)$. The first component is transferred directly from the first port 33 to the second port 35, which in turn is connected to an output terminal. The second component is transferred from the first port 33 to the second port 35 along a more complicated path. First the second component is transferred from the first port 33 to the third port 37 and from the third port 33 to the first pin diode 43a via the first delay line 41a. The first pin diode 43a reflects the second component, which consequently returns to the third port 37, thereby passing the first delay line 41a a second time. At the third port 37, half off the power of the second component is split off, and the second component is then transferred from the third port 37 to the fourth port 39. From the fourth port, the second component is transferred to the second pin diode 43b via the second delay line 41b. The second pin diode 43b reflects the second component, which consequently returns to the fourth port 39, thereby passing the second delay line 41b a second time. At the fourth port 39, half of the power of the second component is once again split off. From the fourth port 39, the second component is transferred to the second port 35. The 3 dB hybrid circuit 31, the pin diodes 43a and 43b and the delay lines 41a and 41b introduce a change of amplitude and a phase shift in the second component, and the second component, when received at the second port 35, is therefore equal to $(0.5)^3 \cdot R_T \cdot \sin(2\pi ft + \phi_T(f))$. $R_T$ is a total reflection coefficient, which is determined by the reflections produced by the pin diodes 43a and 43b. $\phi_T(f)$ is a total frequency dependent phase shift, which is mainly contributed to by the delay lines 41a and 41b. The 3 dB hybrid circuit 31 will also contribute to the total phase shift $\phi_T(f)$ to some extent. At the second port 35, the 3 dB hybrid circuit 31 is arranged to combine the first component $0.5 \cdot \sin(2\pi ft)$ and the second component $(0.5)^3 \cdot R_T \cdot \sin(2\pi ft + \phi_T(f))$, thereby generating a combined signal $0.5 \cdot \sin(2\pi ft) + (0.5)_3 \cdot R_T \cdot \sin(2\pi ft + \phi_T(f))$, which is delivered to the output terminal of the compensation circuit 2 in FIG. 15.

Equation (1) can be used for calculating the gain $G_c$ of the compensation circuit in FIG. 15 by substituting A for $(0.5)^2 \cdot R_T$ and by substituting $\phi(f)$ for $\phi_T(f)$.

The resistances of the pin diodes 43a and 43b are mainly determined by direct currents flowing through the pin diodes 43a and 43b. The compensation circuit 2 in FIG. 15 comprises a current control circuit arranged for controlling the direct currents of the pin diodes 43a and 43b. In the particular example of FIG. 15, the current control circuit includes a voltage generator 44 and current dividing circuitry connected to the voltage generator 44. The current dividing circuitry includes a first and a second branch. The first branch includes a resistor 45a and an inductor 46a, which are connected in series so as to connect the voltage generator 44 with the second port 35 of the 3 dB hybrid circuit 31. The second branch includes similarly a resistor 45b and an inductor 46b, which are connected in series so as to connect the voltage generator 44 with the first port 33 of the 3 dB hybrid circuit 31. The inductors 46a and 46b serve as radio frequency blockers. The branches include also decoupling capacitors 47a and 47b, which prevent time varying signals from being transferred to the voltage generator 44. By varying a voltage from the voltage generator 44, direct currents flowing through the pin diodes 43a and 43b are varied, thereby controlling the resistances of the pin diodes 43a and 43b and, consequently, the reflective properties of the pin diodes 43a and 43b. Alternatively, the current control circuit includes instead two voltage generators, one for each branch. Thus allowing independent control of the direct currents of the pin diodes 43a and 43b. The direct currents of the pin diodes 43a and 43b can, for example, be controlled so that reflection coefficients associated with the pin diodes 43a and 43b obtain different signs.

The above-suggested approach for selecting appropriate parameter values for the embodiments in FIGS. 5 and 6 can be used, for selecting appropriate resistance settings for the pin diodes 43a and 43b and for selecting appropriate lengths of the delay lines 41a and 41b.

The signal reflector 19 in the embodiment of FIG. 13 may include a pin diode as resistive element for producing a reflection. The embodiment of FIG. 13 may in such a case also include a current control circuit for controlling a direct current of the pin diode.

Naturally, the embodiments of the compensation circuit 2 disclosed and indicated above can be combined in any suitable way to form more complex compensation circuits. Moreover, the compensation circuits 2 according the present invention are not limited to providing a compensational gain to a power amplifier but can be used for providing a compensational gain to any device where this is suitable. For example, the compensation circuits according to the present invention can be used together with couplers, transmission cables, striplines, microstrips and radio frequency equipment in general. The compensation circuits according to the present invention can also be used together with small-signal amplifiers (for example based on field-effect transistor technology), e.g in a wireless receiver.

Figure 16:
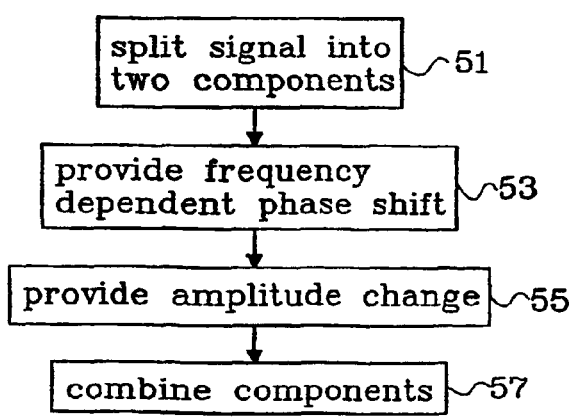
FIG. 16 is flow chart illustrating a method of gain compensation according to the present invention.

FIG. 16 is a flow chart of a method, according to the present invention, for providing a compensational gain. At a block 51, a signal is split into two components, preferably, but not necessarily, of equal power. At a block 53, a frequency dependent phase shift is provided in one of the components. The phase shift is preferably provided in the form of a predetermined time delay, although the invention is not limited to providing the phase shift in the form of a time delay. At a block 55, a change of amplitude is provided in one of the components. The change of amplitude can be obtained in many ways, e.g. by attenuating one of the components and/or by using on or more signal reflections to obtain the change of amplitude. At a block 57, the components are combined (added together) after providing the phase shift and the change of amplitude, thereby producing a combined signal.

The method in FIG. 16 can be used for providing a compensational gain for compensating for a non-flat gain of a power amplifier or for providing a compensational gain to some other device.

What is claimed is:

1. A method comprising:
  providing a compensational gain to a device having a gain with an unwanted frequency dependence,
  splitting a signal into two components;
  providing a frequency dependent phase shift in one of the components resulting in a frequency dependent phase difference between the two components;
  providing a change of amplitude in one of the components; and
  combining the components after the providing of the phase shift and the change of amplitude.

2. A method according to claim 1, wherein the providing of the frequency dependent phase shift includes introducing a predetermined time delay.

3. A method according to claim 2, wherein the introducing of the time delay includes using at least one delay line.

4. A method according to claim 1, wherein the providing of a change of amplitude includes attenuating one of the components.

5. A method according to claim 1, wherein the providing of the change of amplitude includes reflecting one of the components at least once.

6. A method according to claim 1, wherein the splitting of the signal includes that the components obtain equal power.

7. A method according to claim 1, wherein the device is a power amplifier having a non-flat gain.

8. A method according to claim 7, wherein the providing of the compensational gain is performed before the power amplifier.

9. An arrangement, comprising:
  a device having a gain with an unwanted frequency dependence; and
  a compensation circuit for providing a compensational gain to the device, wherein the compensation circuit includes:
  a splitter for splitting a signal into two components;
  a phase shifter for providing a frequency dependent phase shift in one of the components resulting in a frequency dependent phase difference between the two components;
  an amplitude adjuster for providing a change of amplitude in one of the components; and
  a combiner for combining the components after providing the phase shift and the change of amplitude.

10. An arrangement according to claim 9, wherein the phase shifter includes means for introducing a predetermined time delay.

11. An arrangement according to claim 10, wherein the means for introducing the time delay includes at least one delay line.

12. An arrangement according to claim 9, wherein the amplitude changer includes at least one attenuator.

13. An arrangement according to claim 9, wherein the amplitude changer includes at least one signal reflector.

14. An arrangement according to claim 9, wherein the splitter is arranged so that the components obtain equal power.

15. An arrangement according to claim 9, wherein the compensation circuit comprises a 3 dB hybrid circuit, the 3 dB hybrid circuit including:
  a first port, the 3 dB hybrid circuit being arranged for receiving the signal via the first port;
  a second port, the 3 dB circuit being arranged for delivering the combined components via the second port;
  a third port, the third port being connected to a first signal reflector; and
  a fourth port, the fourth port being connected to a second reflector.

16. An arrangement according to claim 15, wherein at least one of the third and fourth port is connected to the corresponding signal reflector via a corresponding phase shifter having a frequency dependent phase shift.

17. An arrangement according to claim 15, wherein at least one of the signal reflectors includes a pin diode.

18. An arrangement according to claim 17, wherein the compensation circuit comprises means for controlling a direct current of the or each pin diode.

19. An arrangement according to claim 9, wherein the device is a power amplifier having a non-flat gain.

20. An arrangement according to claim 19, wherein the compensation circuit is arranged before the power amplifier.

* * * * *